United States Patent
Helms et al.

(10) Patent No.: US 7,205,836 B2
(45) Date of Patent: Apr. 17, 2007

(54) SIGE DIFFERENTIAL CASCODE AMPLIFIER WITH MILLER EFFECT RESONATOR

(75) Inventors: David Richard Helms, Tyngsboro, MA (US); Robert Warrant Point, Jr., Groveland, MA (US)

(73) Assignee: M/A-Com, Inc., Lowell, MA (US)

( * ) Notice: Subject to any disclaimer, the term of this patent is extended or adjusted under 35 U.S.C. 154(b) by 97 days.

(21) Appl. No.: 11/120,844

(22) Filed: May 3, 2005

(65) Prior Publication Data

US 2006/0250184 A1 Nov. 9, 2006

(51) Int. Cl.
 *H03F 3/45* (2006.01)
(52) U.S. Cl. .................. 330/252; 330/311; 330/302
(58) Field of Classification Search ................ 330/252, 330/302, 311
 See application file for complete search history.

(56) References Cited

U.S. PATENT DOCUMENTS

| | | | |
|---|---|---|---|
| 3,895,306 A * | 7/1975 | Rebeles | 330/271 |
| 4,028,631 A | 6/1977 | Ahmed | 330/19 |
| 4,638,263 A * | 1/1987 | van Rumpt et al. | 331/116 R |
| 5,130,664 A * | 7/1992 | Pavlic et al. | 330/55 |
| 5,142,239 A * | 8/1992 | Brayton et al. | 330/66 |
| 5,218,318 A * | 6/1993 | Ikuzawa | 330/254 |
| 5,451,906 A * | 9/1995 | Kaltenecker | 330/292 |
| 6,407,640 B1 | 6/2002 | Aparin et al. | |
| 6,760,381 B2 | 7/2004 | Lu | 375/257 |
| 2002/0024719 A1 | 2/2002 | Rosenberg et al. | |
| 2005/0062534 A1 | 3/2005 | Joo et al. | |

FOREIGN PATENT DOCUMENTS

EP 0 915 565 A2 5/1999

* cited by examiner

*Primary Examiner*—Patricia Nguyen

(57) ABSTRACT

A high-power, high frequency (1–100 GHz) power amplifier, made using SiGe transistors. A differential common-emitter amplifier section supplies the voltage amplification, allowing the total voltage swing of the amplifier to be twice the breakdown voltage of the individual transistors. Current amplification is supplied by a differential common-emitter amplifier section, connected in cascode with the differential common-emitter amplifier section. Appropriately chosen resonators in the cascode connection resonate out the Miller effect, negative current feed back of the circuit at the amplifier's operational frequency, allowing the amplifier to provide high power output at the operational frequency.

20 Claims, 4 Drawing Sheets

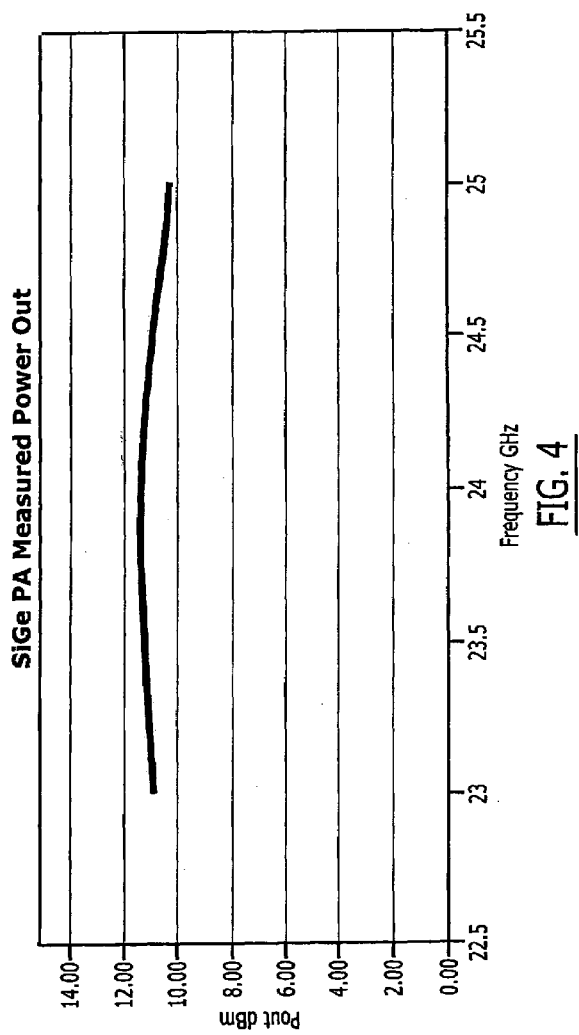

SIGE DIFFERENTIAL CASCODE AMPLIFIER WITH MILLER EFFECT RESONATOR

FIELD OF THE INVENTION

The present invention relates to power amplifiers, and more particularly to high frequency SiGe power amplifiers.

BACKGROUND OF THE INVENTION

Silicon-Germanium (SiGe) transistors are high-speed, low cost transistors. They are produced by growing a thin, epitaxial layer of Ge on a Si substrate. Because of the 4% difference in size between the Si and Ge lattice structures, the Si lattice near the surface of the Si substrate is strained, allowing material parameters such as the band gap to be varied. In particular the strained Si has increased carrier mobility (2–3 time greater than Si), allowing faster switching-speed transistors to be fabricated. Moreover, because the Ge is a thin, epitaxial layer, standard Si fabrication technology can be used, resulting in low costs and providing compatibility with conventional CMOS technology.

The high speed switching of SiGe bipolar transistors, however, comes at the cost of reduced transistor breakdown voltage and increased intrinsic capacitance of the transistors. These drawbacks become particularly troublesome when attempting to implement SiGe class A high-power amplifiers capable of operating at high frequencies (greater than 1 GHz). In such amplifiers, the power output is proportional to the product of the current and the voltage, i.e., power=$(V_{rms} \cdot I_{rms})/2$. The reduced break down voltage, therefore, significantly reduces the maximum power that can be output from an amplifier using SiGe transistors. In addition, the high intrinsic capacitance of the transistors results in significant negative feedback of current at high frequencies (greater than 1 GHz), further reducing the power output of such amplifiers. And finally, the lack of via holes causes high inductive feedback which greatly decreases gain.

What is needed is a method and apparatus that enables high-speed, low-cost SiGe bipolar transistors to be effectively used in high-speed power amplifiers.

SUMMARY OF THE INVENTION

The present invention provides a method and apparatus for providing a high-power, high frequency (1–100 GHz) amplifier using SiGe transistors as the main active components.

In one embodiment of the high-power, high frequency amplifier, a differential common-emitter amplifier provides voltage amplification. The differential arrangement allows the total voltage swing of the amplifier to be substantially twice the breakdown voltage of the transistors. Current amplification is then provided by a differential common-base amplifier connected in cascode with the common-emitter front-end, voltage amplifier. By making the cascode connection via appropriately chosen resonators, acting primarily as inductors, the negative current feed-back (an example of the Miller effect) that reduces the current amplification at high frequency operation, can be significantly reduced, or resonated out, at the amplifier's operational frequency.

These and other features of the invention will be more fully understood by references to the following drawings.

BRIEF DESCRIPTION OF THE DRAWINGS

FIG. 4 is a graph showing the measured power output of a further embodiment of the differential power amplifier of the present invention.

DETAILED DESCRIPTION

The present invention provides a method and apparatus for obtaining power amplification at high frequencies (1–100 GHz) using Silicon-Germanium (SiGe) transistors.

SiGe devices consist of thin layers of Ge grown over Si. Because of the 4% difference in lattice structures, the resultant combination has lattices that are strained, allowing material parameters such as the band gap to be varied. In particular, the strained Si has increased carrier mobility (2–3 time greater than Si), allowing faster switching-speed transistors to be fabricated. The increased switching-speed, however, comes at the cost of reduced break down voltage of the devices. In a class A power amplifier, the power output is proportional to the product of the current and the voltage, i.e., power=$V_{rms} \cdot I_{rms}/2$. The reduced break down voltage, therefore, significantly reduces the maximum power that can be output from an amplifier using SiGe transistors.

SiGe amplifiers exhibit a further reduction in power at high frequencies because of negative current feed back via the intrinsic capacitance of the transistors. This effect is an example of the Miller effect.

The present invention allows high frequency SiGe transistors to be used in power amplifiers by splitting the voltage swing across differentially connected pairs of cascaded common-emitter and common-base amplifiers, and providing resonators to reduce or eliminate the Miller effect at the amplifier's operational frequency. The common-emitter amplifiers provide the voltage gain and the common-base amplifiers provide the bulk of the current gain. The two cascaded amplifier pairs are differentially connected, 180 degrees out of phase, by inductively connecting the base inputs. Resonators are provided between the common-emitter and the common-base stages, and between the bases of the common-base amplifiers in order to resonate out the Miller effect that results from differentially coupling the two pairs of cascaded amplifiers.

A preferred embodiment of the present invention will now be described in detail by reference to the accompanying drawings in which, as far as possible, like numbers represent like elements.

Figure 1:
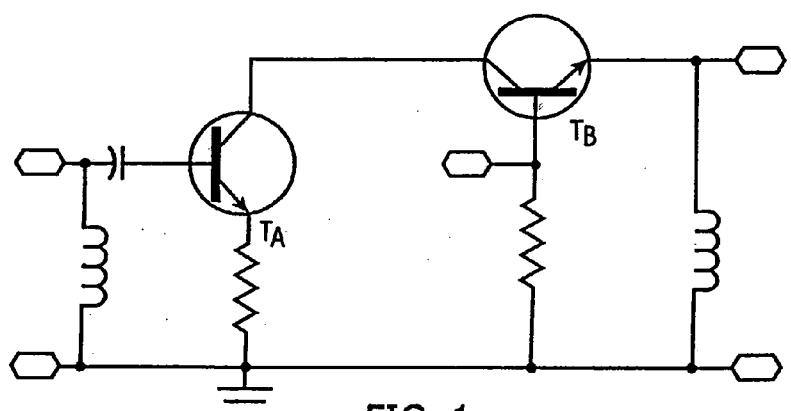
FIG. 1 is a schematic drawing showing a pair of transistors configured as a common emitter amplifier in cascade with a common base amplifier.

FIG. 1 is a schematic drawing of a prior art amplifier showing a pair of bipolar transistors $T_A$ and $T_B$ configured as a common-emitter amplifier in cascade with a common-base amplifier, i.e., the two transistors share the same current. This is a well known configuration and is commonly used to provide class A power amplifiers. In such designs, the common emitter transistor $T_A$ provides a large voltage gain, while the common base transistor $T_B$ provides a large current gain. As the output power of a class A amplifier is approximately half the root mean squared (RMS) output voltage multiplied by the RMS output current, such designs typically have good output power levels.

However, the basic circuit of FIG. 1 has limitations when used to provide power at high frequencies (greater than 1 GHz), especially with bipolar transistors having a low breakdown voltage, such as SiGe bipolar transistors. At high frequencies, the intrinsic capacitances of such transistors become appreciable, reducing the power output because of negative feedback via these intrinsic capacitances. This effect is an example of the Miller effect.

Figure 2:
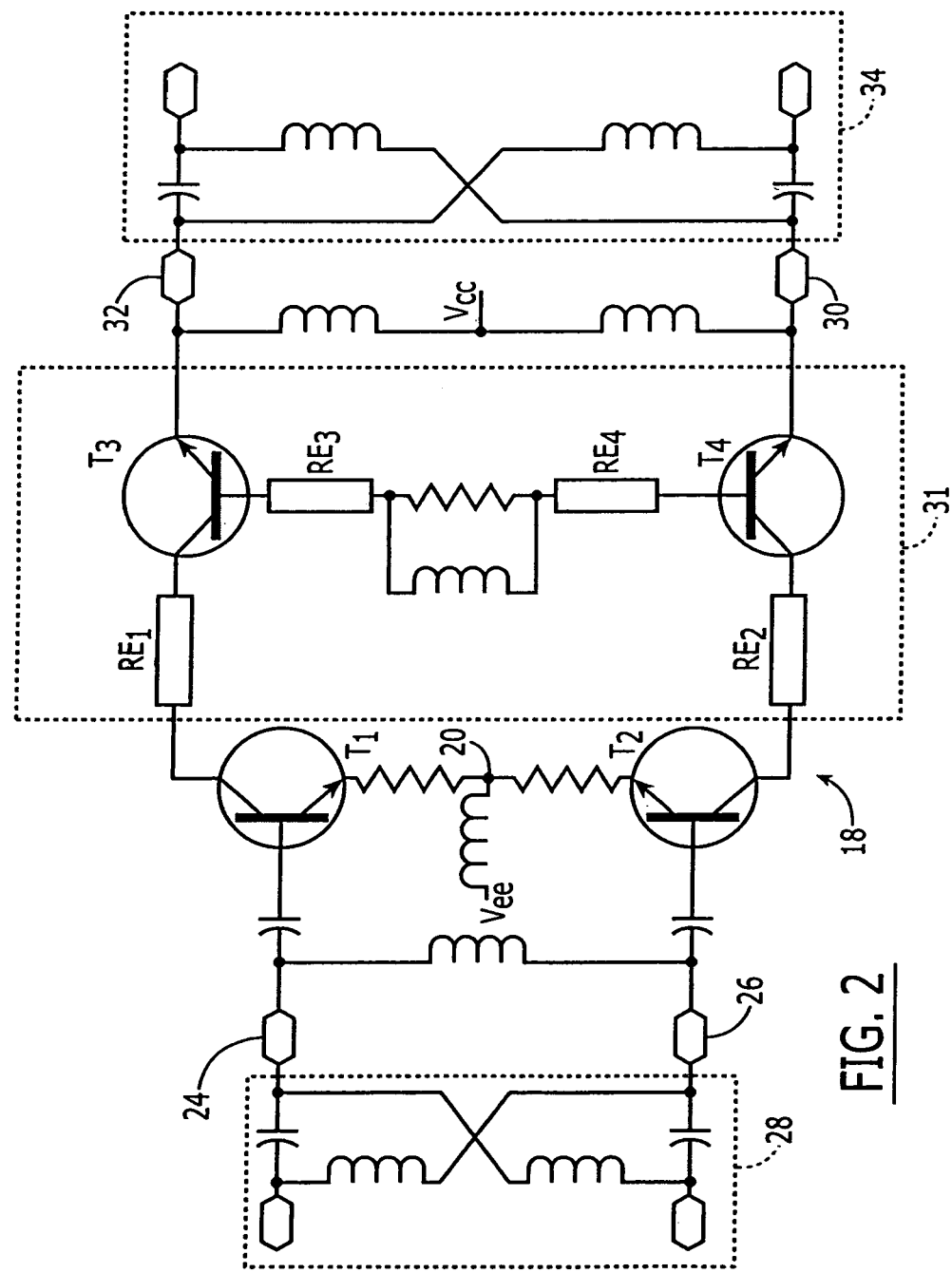
FIG. 2 is a schematic drawing showing an embodiment of the differential power amplifier of the present invention.

FIG. 2 is a schematic drawing showing an embodiment of the differential power amplifier 18 of the present invention. In this embodiment of a high power, high frequency amplifier, the input voltage signal is applied to a differential common-emitter amplifier, comprised of two SiGe transistors. By splitting the input voltage differentially across two transistors, the total voltage swing can effectively double the breakdown voltage of the individual transistors. The output of the differential common-emitter amplifier is cascoded to a differential common-base amplifiers, which supplies the current amplification. By providing appropriately chosen resonators between the common-emitter and the common-base stages, and between the bases of the common-base amplifiers, the Miller effect can be significantly reduced, even resonated out, at the operational frequency, i.e., the negative feedback of current across the transistor via their intrinsic capacitances can be effectively eliminated at the amplifier's operational frequency. As a result, the amplifier can produce considerably higher currents, and therefore power.

In particular, the amplifier 18 comprises two differentially connected common-emitter transistors T1 and T2 as the voltage amplification stage. This differential common-emitter amplifier is connected in cascade with a differential common-base amplifier comprised of two differentially connected common-base transistors T3 and T4. Resonators RE1, RE2, RE3, and RE4 form part of the interconnection between these transistors T3 and T4. In particular, the common-emitter transistor T1 and the common-base transistor T3 are connected by a resonator RE1, the common-emitter transistor T2 and the common-base transistor T4 are connected by a resonator RE2 and the common-base transistors T3 and T4 are connected by a pair of resonators RE3 and RE4 in series.

The differential inputs 24 and 26 may feed an unbalanced signal, such as, but not limited to, the signal available on a grounded co-axial cable, via a balun 28. The balun 28 converts the unbalanced signal into a balanced signal so that inputs 24 and 26 experience the same voltage values, but are 180 degrees out of phase. This creates a virtual ground at point 20, and allows the total voltage variation to be spread across transistors T1 and T2, essentially doubling the maximum voltage that can be supplied by the power amplifier.

The resonator RE1 has an inductance value that resonates out the Miller effect of the collector-base capacitance of transistor T1. This value can be estimated as the parallel inductor-capacitor resonance values at the amplifier's operational frequency, i.e., L=ω2/C, where L is the resonator inductance, ω is the amplifier operational frequency and C is the intrinsic collector-base capacitance of transistor T1. In practice, these estimated resonator values are refined by iterative feedback using circuit modeling computer models. Similarly, the resonator RE2 has an inductance value that resonates out the Miller effect of the collector-base capacitance of transistor T2, the resonator RE3 has an inductance value that resonates out the Miller effect of the collector-base capacitance of transistor T3, and the resonator RE4 has an inductance value that resonates out the Miller effect of the collector-base capacitance of transistor T4. By preventing negative feedback across the transistors at the amplifier's operational frequency, the amplifier can produce considerably higher currents, and therefore power The balanced, 180 degree out of phase, differential signal at output terminals 30 and 32 may be converted to an unbalanced signal suitable for transmission on, for instance, a coaxial cable, by balun 34.

In a further embodiment of the invention, the core section 31 of the current amplification stage can be repeated, i.e. the circuit of FIG. 2 can be extended by inserting one or more copies of the core section 31 in series with the existing core section 31. Repeating this core section 31 further reduces the load on individual components, thereby increasing the operational breakdown voltage. The first repeated copy of core section 31 may be inserted in series between the existing core section 31 and the two shunt capacitors at $V_{OC}$. This may be repeated with additional copies of core section 31.

Figure 3:
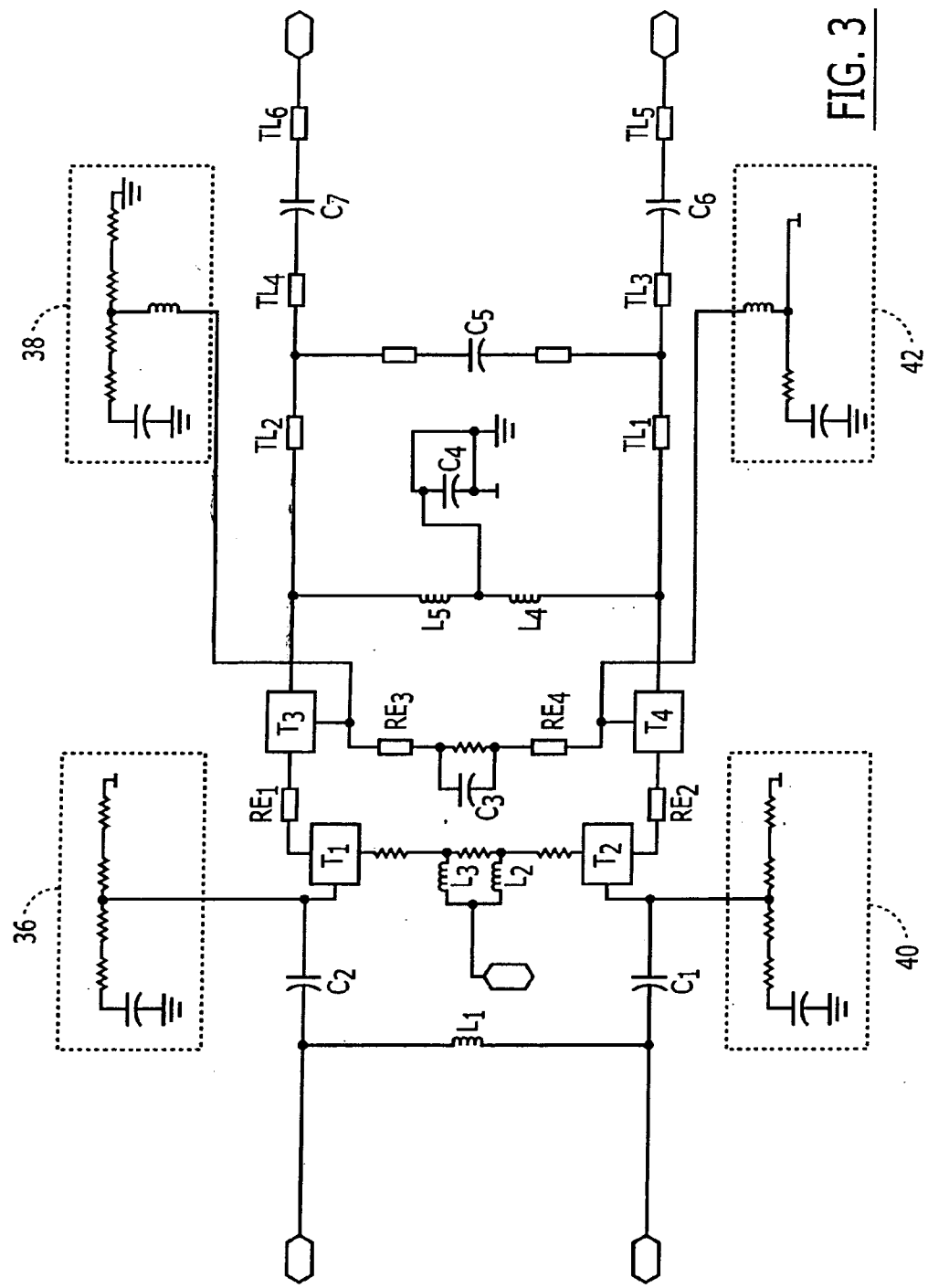
FIG. 3 is a detail schematic drawing showing a further embodiment of the differential power amplifier of the present invention.

FIG. 3 is a detailed schematic drawing showing a further embodiment of the differential power amplifier of the present invention. In addition to the transistors T1, T2, T3 and T4 and resonators RE1, RE2, RE3 and RE4, the differential power amplifier 50 comprises bias resistor chains 36, 38, 40 and 42 as well as capacitors C1–C7, and inductors L1–L5 and transmission lines TL1–TL8.

The transistors T1–T4 may, for instance, be bi-polar SiGe transistors having a doped gate region measuring 8 by 3 by 0.5 μm. The shunt resonators RE3 and RE4 may, for instance, be formed as transmission lines 3 by 16 μm in size. The series resonators RE1 and RE2 may be formed as transmission lines 10 by 150 μm in size.

FIG. 4 is a graph showing the measured power output of a further embodiment of the differential power amplifier of the present invention that uses bi-polar SiGe transistors. As can be seen from FIG. 4, the measured large signal gain of the power amplifier is greater than 10 dB, over the frequency range from 23 to 25 GHz. This is a significant improvement over other power amplifiers at these frequencies. For instance, a power amplifier having a bi-polar SiGe transistor, differential common-emitter cascaded to a differential common-base, typically has a large signal gain that is limited to about 3 dB over the same frequency range, and a small signal gain limited to about 4 dB. The small signal power gain of the differential power amplifier of the present invention has been measured to be as high as 20 dB.

Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention.

What is claimed is:

1. A method of providing a high-frequency, high-power amplifier, said method comprising the steps of:
    providing a first and a second transistor configured as a differential common-emitter amplifier;
    providing a third and a forth transistor configured as a differential common-base amplifier; and
    connecting the collector of said first transistor to the collector of said third transistor via a first resonator, and the collector of said second transistor to the collector of said forth transistor via a second resonator.

2. The method of claim 1 wherein said first resonator has a value chosen to significantly reduce current feedback via the inherent collector-base capacitance of said first transistor at an operating frequency of said high-frequency, high-power amplifier, and said second resonator has a value chosen to significantly reduce current feedback via the inherent collector-base capacitance of said second transistor at said operating frequency.

3. The method of claim 1 wherein said first resonator has a value that is substantially equal to the square of the amplifier operational frequency divided by the value of the inherent collector-base capacitance of said first transistor, and wherein said second resonator has a value that is substantially equal to the square of the amplifier operational frequency divided by the value of the inherent collector-base capacitance of said second transistor, thereby effectively resonating out current feedback across said first and second transistors.

4. The method of claim 2 wherein said differential configuration of said third and fourth transistors comprises providing a third resonator connected to the base of said third transistor; and providing a forth resonator connected to the base of said fourth transistor, wherein said third and forth resonators are in series with each other.

5. The method of claim 4 wherein said third resonator has a value chosen to significantly reduce current feedback via the inherent collector-emitter capacitance of said third transistor at said operating frequency, and said fourth resonator has a value chosen to significantly reduce current feedback via the inherent collector-emitter capacitance of said forth transistor at said operating frequency.

6. The method of claim 4 wherein said third resonator has a value that is substantially equal to the square of the amplifier operational frequency divided by the value of the inherent collector-emitter capacitance of said third transistor, and wherein said fourth resonator has a value that is substantially equal to the square of the amplifier operational frequency divided by the value of the inherent collector-emitter capacitance of said forth transistor, thereby effectively resonating out current feedback across said third and forth transistors.

7. The method of claim 1 in which said transistors are SiGe transistors.

8. The method of claim 5 further comprising providing an input signal via an input balun.

9. The method of claim 6 further comprising providing an output signal via an output balun.

10. A high-frequency, high-power amplifier, comprising:
a first and a second transistor configured as a differential common-emitter amplifier;
a third and a fourth transistor configured as a differential common-base amplifier;
a first resonator connecting the collector of said first transistor to the collector of said third transistor; and
a second resonator connecting the collector of said second transistor to the collector of said forth transistor.

11. The amplifier of claim 10 wherein said first resonator has a value chosen to significantly reduce current feedback via the inherent collector-base capacitance of said first transistor at an operating frequency of said high-frequency, high-power amplifier, and said second resonator has a value chosen to significantly reduce current feedback via the inherent collector-base capacitance of said second transistor at said operating frequency.

12. The amplifier of claim 10 wherein said first resonator has a value that is substantially equal to the square of the amplifier operational frequency divided by the value of the inherent collector-base capacitance of said first transistor, and wherein said second resonator has a value that is substantially equal to the square of the amplifier operational frequency divided by the value of the inherent collector-base capacitance of said second transistor, thereby effectively resonating out current feedback across said first and second transistors.

13. The amplifier of claim 11 further comprising a third resonator connected to the base of said third transistor; and a fourth resonator connected to the base of said fourth transistor, and wherein said third and fourth resonators are in series with each other.

14. The amplifier of claim 13 wherein said third resonator has a value chosen to significantly reduce current feedback via the inherent collector-emitter capacitance of said third transistor at said operating frequency, and said fourth resonator has a value chosen to significantly reduce current feedback via the inherent collector-emitter capacitance of said fourth transistor at said operating frequency.

15. The amplifier of claim 13 wherein said third resonator has a value that is substantially equal to the square of the amplifier operational frequency divided by the value of the inherent collector-emitter capacitance of said third transistor, and wherein said fourth resonator has a value that is substantially equal to the square of the amplifier operational frequency divided by the value of the inherent collector-emitter capacitance of said fourth transistor, thereby effectively resonating out current feedback across said third and forth transistors.

16. The amplifier of claim 10 in which said transistors are SiGe transistors.

17. A device for providing high-frequency, high-power amplification, comprising:
means for differential voltage amplification comprising a first and a second transistor configured as a differential common-emitter amplifier;
means for differential current amplification comprising a third and a fourth transistor configured as a differential common-base amplifier;
a first resonator means connecting the collector of said first transistor to the collector of said third transistor; and
a second resonator means connecting the collector of said second transistor to the collector of said fourth transistor.

18. The device of claim 17 wherein said first resonator has a value chosen to significantly reduce current feedback via the inherent collector-base capacitance of said first transistor at an operating frequency of said high-frequency, high-power amplifier, and said second resonator has a value chosen to significantly reduce current feedback via the inherent collector-base capacitance of said second transistor at said operating frequency.

19. The device of claim 18 wherein said first resonator has a value that is substantially equal to the square of the amplifier operational frequency divided by the value of the inherent collector-base capacitance of said first transistor, and wherein said second resonator has a value that is substantially equal to the square of the amplifier operational frequency divided by the value of the inherent collector-base capacitance of said second transistor, thereby effectively resonating out current feedback across said first and second transistors.

20. The device of claim 17 in which said transistors are SiGe transistors.

* * * * *